United States Patent
Aoki et al.

(10) Patent No.: US 10,581,760 B2
(45) Date of Patent: Mar. 3, 2020

(54) RELAY APPARATUS

(71) Applicant: FUJITSU LIMITED, Kawasaki-shi, Kanagawa (JP)

(72) Inventors: Kenji Aoki, Kawasaki (JP); Shinnosuke Matsuda, Kawasaki (JP); Katsuya Niigata, Kawasaki (JP); Sadayuki Ohyama, Chigasaki (JP)

(73) Assignee: FUJITSU LIMITED, Kawasaki (JP)

( * ) Notice: Subject to any disclaimer, the term of this patent is extended or adjusted under 35 U.S.C. 154(b) by 749 days.

(21) Appl. No.: 15/086,689

(22) Filed: Mar. 31, 2016

(65) Prior Publication Data
US 2016/0323206 A1    Nov. 3, 2016

(30) Foreign Application Priority Data

Apr. 30, 2015 (JP) ................ 2015-093634

(51) Int. Cl.
| | |
|---|---|
| H04L 12/931 | (2013.01) |
| H05K 7/02 | (2006.01) |
| H05K 7/14 | (2006.01) |
| H05K 7/18 | (2006.01) |

(52) U.S. Cl.
CPC ............ *H04L 49/405* (2013.01); *H05K 7/02* (2013.01); *H05K 7/1422* (2013.01); *H05K 7/18* (2013.01)

(58) Field of Classification Search
USPC .............. 709/203; 361/695, 760, 788, 794, 361/679.48, 679.31, 727
See application file for complete search history.

(56) References Cited

U.S. PATENT DOCUMENTS

| | | | | |
|---|---|---|---|---|
| 5,586,250 A | * | 12/1996 | Carbonneau | G06F 3/0607 714/44 |
| 6,014,319 A | * | 1/2000 | Kuchta | G06F 1/184 361/788 |
| 6,058,019 A | * | 5/2000 | Graves | G06F 1/184 361/760 |

(Continued)

FOREIGN PATENT DOCUMENTS

| | | | | |
|---|---|---|---|---|
| CN | 101349935 A | * | 1/2009 | ............... H05K 7/14 |
| JP | 2002-516493 A | | 6/2002 | |

(Continued)

OTHER PUBLICATIONS

Japanese Office Action dated Nov. 20, 2018 for corresponding Japanese Patent Application No. 2015-093634, with English Translation, 9 pages. *Please note JP-2002-516493-A cited herewith, was previously cited in an IDS filed on Mar. 31, 2016.*.

*Primary Examiner* — James N Fiorillo
(74) *Attorney, Agent, or Firm* — Fujitsu Patent Center (57) ABSTRACT

A relay apparatus includes first and second board modules and a bridge module. The first board module is configured to relay the communications among the plurality of electronic devices, the plurality of electronic devices being connected to the first board module. The second board module is configured to relay the communications among the plurality of electronic devices, the plurality of electronic devices being connected to the second board module. The bridge module is configured to communicatively connect the first board module and the second board module.

7 Claims, 11 Drawing Sheets

(56) References Cited

U.S. PATENT DOCUMENTS

| | | | | |
|---|---|---|---|---|
| 6,091,609 A * | 7/2000 | Hutson | G06F 1/184 | 361/794 |
| 6,112,311 A * | 8/2000 | Beardsley | G06F 11/2005 | 710/8 |
| 6,368,064 B1 * | 4/2002 | Bendikas | F04D 25/166 | 318/563 |
| 6,392,884 B1 * | 5/2002 | Chou | G06F 1/184 | 360/98.01 |
| 6,408,343 B1 * | 6/2002 | Erickson | G06F 11/2092 | 710/15 |
| 6,483,107 B1 * | 11/2002 | Rabinovitz | G06F 1/181 | 250/239 |
| 6,833,995 B1 * | 12/2004 | Hsue | G06F 1/20 | 211/184 |
| 7,089,338 B1 * | 8/2006 | Wooten | G06F 13/24 | 710/110 |
| 7,154,902 B1 * | 12/2006 | Sikdar | H04L 45/02 | 370/412 |
| 7,274,696 B1 * | 9/2007 | Sikdar | H04L 45/60 | 370/351 |
| 7,277,425 B1 * | 10/2007 | Sikdar | H04L 12/5601 | 370/351 |
| 7,395,393 B2 * | 7/2008 | Shiraki | G06F 21/6227 | 710/36 |
| 7,509,446 B2 * | 3/2009 | Hayashita | G06F 13/4291 | 710/107 |
| 7,610,509 B2 * | 10/2009 | Abe | G06F 11/2007 | 714/11 |
| 7,644,199 B2 * | 1/2010 | Matsushige | G06F 13/4072 | 710/11 |
| 8,854,831 B2 * | 10/2014 | Arnouse | H05K 7/20709 | 361/788 |
| 2005/0232285 A1 * | 10/2005 | Terrell | H04L 67/1097 | 370/401 |
| 2006/0112198 A1 * | 5/2006 | Kurokawa | G06F 3/0605 | 710/19 |
| 2006/0117159 A1 * | 6/2006 | Ohara | G06F 3/0605 | 711/165 |
| 2006/0176648 A1 * | 8/2006 | Inoue | G11B 33/12 | 361/600 |
| 2006/0282594 A1 * | 12/2006 | Motoe | G06F 13/409 | 710/301 |
| 2007/0050425 A1 * | 3/2007 | Ichikawa | G06F 11/0709 | |
| 2007/0097659 A1 * | 5/2007 | Behrens | G06F 1/18 | 361/788 |
| 2007/0240019 A1 * | 10/2007 | Brady | G06F 13/4291 | 714/43 |
| 2007/0285851 A1 * | 12/2007 | Hillman | G06F 13/409 | 361/18 |
| 2008/0126851 A1 * | 5/2008 | Zadigian | G06F 11/2092 | 714/6.32 |
| 2008/0147934 A1 * | 6/2008 | Nonaka | G06F 3/061 | 710/74 |
| 2008/0253077 A1 * | 10/2008 | Miyamoto | G06F 1/187 | 361/679.31 |
| 2009/0228652 A1 * | 9/2009 | Takemoto | G06F 11/2092 | 711/114 |
| 2010/0077252 A1 * | 3/2010 | Siewert | G06F 11/008 | 714/6.12 |
| 2011/0117754 A1 * | 5/2011 | Hirano | H05K 7/1445 | 439/62 |
| 2011/0179234 A1 * | 7/2011 | Kanayama | G06F 3/0617 | 711/154 |
| 2014/0133091 A1 * | 5/2014 | Shah | H05K 7/1488 | 361/679.48 |
| 2014/0204522 A1 * | 7/2014 | Keffeler | G11B 33/128 | 361/679.31 |
| 2014/0204525 A1 * | 7/2014 | Pecone | H05K 13/00 | 361/679.33 |
| 2014/0204537 A1 * | 7/2014 | Rust | H05K 7/02 | 361/727 |
| 2014/0223097 A1 | 8/2014 | Ohara et al. | | |
| 2014/0362515 A1 * | 12/2014 | Pronozuk | H05K 7/1488 | 361/679.31 |
| 2015/0019903 A1 * | 1/2015 | Arroyo | G06F 11/2002 | 714/5.1 |
| 2015/0160690 A1 * | 6/2015 | Kagy | H04L 12/6418 | 361/679.4 |
| 2016/0120062 A1 * | 4/2016 | Shi | H05K 7/1422 | 361/695 |
| 2016/0150677 A1 * | 5/2016 | Thao | H05K 7/20136 | 361/695 |
| 2017/0367211 A1 * | 12/2017 | Easton | H05K 7/1492 | |

FOREIGN PATENT DOCUMENTS

| | | |
|---|---|---|
| JP | 2006-155392 A | 6/2006 |
| JP | 2008-10592 A | 1/2008 |
| JP | 2009-217519 A | 9/2009 |
| JP | 2010-049716 A | 3/2010 |

* cited by examiner

RELAY APPARATUS

CROSS-REFERENCE TO RELATED APPLICATION

This application is based upon and claims the benefit of priority of the prior Japanese Patent application No. 2015-93634, filed on Apr. 30, 2015, the entire contents of which are incorporated herein by reference.

FIELD

The embodiment discussed herein relates to a relay apparatus.

BACKGROUND

One type of controller enclosures (CEs) provided to storage apparatuses is known, wherein midplanes (MPs) are provided in the central part of housings and multiple modules can be mounted to and unmounted from the MPs, from the front and/or rear of the housings.

Additionally, techniques to provide such CEs with redundancy by duplicating modules which are inserted into or are removed from the MPs have been known. In such a configuration, when one of the duplicated modules fails, a hot replacement of the failed module can be carried out, without stopping the operation of the storage apparatus.

Patent Document 1: Japanese National Publication of International Patent Application No. 2002-516493
Patent Document 2: Japanese Laid-open Patent Publication No. 2009-217519
Patent Document 3: Japanese Laid-open Patent Publication No. 2010-49716
Patent Document 4: Japanese Laid-open Patent Publication No. 2006-155392

In storage apparatuses as described above, however, since an MP is not duplicated, in the case of a failure of the MP, the operation by the storage apparatus is stopped for making a replacement of MPs.

SUMMARY

Accordingly, a relay apparatus relays communications among a plurality of electronic devices provided in a storage apparatus. The relay apparatus includes a first board module configured to relay the communications among the plurality of electronic devices, the plurality of electronic devices being connected to the first board module, a second board module configured to relay the communications among the plurality of electronic devices, the plurality of electronic devices being connected to the second board module, and a bridge module configured to communicatively connect the first board module and the second board module.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, an embodiment of the present invention will be described with reference to the drawings. It is to be noted that, however, the embodiment described below is merely exemplary, and it is not intended that various modifications and applications of the techniques are excluded. In other words, the present embodiment may be practiced in various modifications without departing from the extent thereof.

It is also not intended that only the elements depicted in the drawings are provided, and it is to be noted that other functions and the like may be included.

In the drawings, the like reference symbols denote similar elements, and descriptions thereof are thus omitted hereinafter.

[A] Example of Embodiment

[A-1] System Configuration

Figure 1:
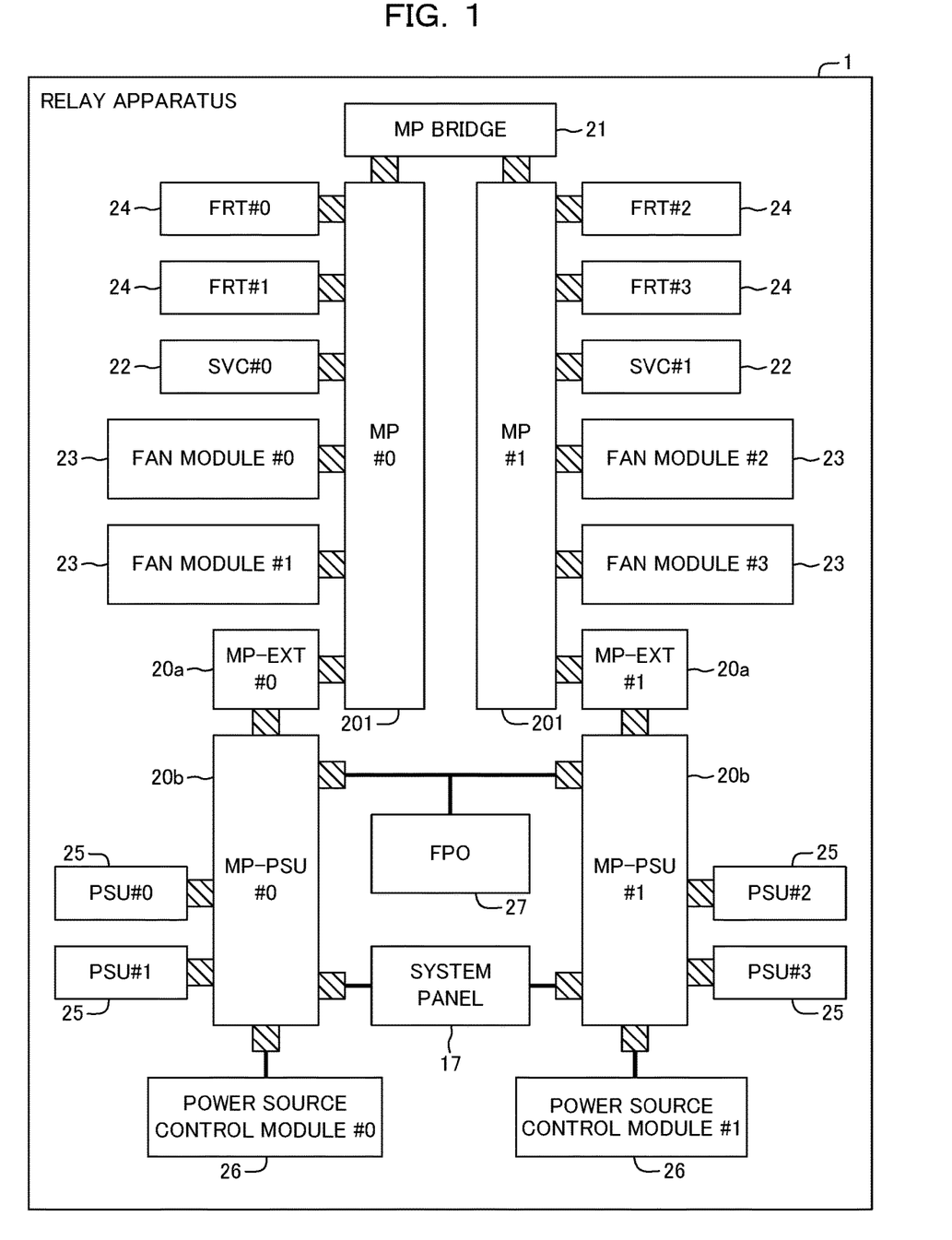
FIG. 1 is a diagram schematically depicting a functional configuration of a relay apparatus as one example of an embodiment.
Figure 2:
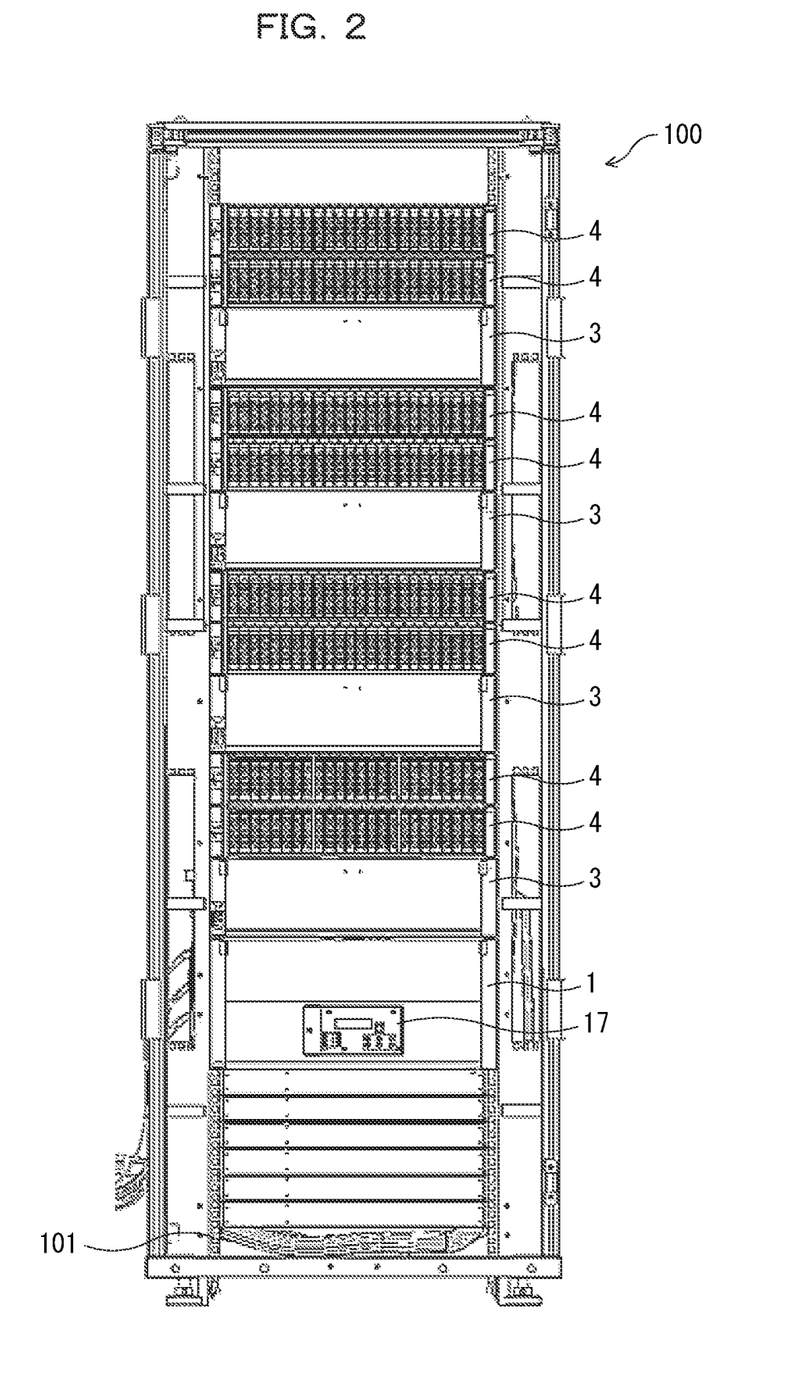
FIG. 2 is an external view exemplifying a configuration of a storage apparatus as one example of an embodiment.

FIG. 1 is a diagram schematically depicting a functional configuration of the relay apparatus as one example of an embodiment, and FIG. 2 is an external view exemplifying a configuration of a storage apparatus as one example of an embodiment.

As depicted in FIG. 2, a relay apparatus 1 in one example of the present embodiment is provided to a storage apparatus 100.

The storage apparatus 100 includes multiple storage devices, and presents an apparatus to provide a server apparatus (not illustrated) with storage areas, wherein data is redundantly distributed across the multiple storage devices using the Redundant Arrays of Inexpensive Disks (RAID) technique, for example. In addition to the relay apparatus 1, as depicted in FIG. 2, the storage apparatus 100 also includes multiple (four in the example depicted in FIG. 2) CEs 3 and multiple (eight in the example depicted in FIG. 2) disk enclosures (DEs) 4. To accommodate the relay apparatus 1, the CEs 3, and the DEs 4, the storage apparatus 100 includes a 19-inch rack (rack) 101, for example, wherein the relay apparatus 1, the CEs 3, and the DEs 4 are detachably mounted.

Each CE 3 represents one example of an electronic device, and includes multiple controller modules (CM; control devices) (not illustrated) configured to perform various controls in accordance with storage access requests (access control signals, therein referred to as host inputs/outputs (I/Os)) from a server apparatus (not illustrated).

Each DE 4 includes multiple storage devices (not illustrated) that are known devices, such as hard disk drives (HDD) and solid state drives (SSDs), configured to readably and writably store data.

The relay apparatus 1 is an apparatus configured to connect the multiple CEs 3 so as to be communicative to each other. As depicted in FIG. 1, the relay apparatus 1 includes a system panel 17, two midplanes (the MPs #0 and #1) 201, two MP extensions (MP-EXTs #0 and #1) 20a, two MP power supply units (MP-PSUs #0 and #1) 20b, an MP bridge 21, two service controllers (SVCs #0 and #1) 22, four fan modules #0-#3 23, four font end routers (FRTs #0-#3) 24, four power supply units (PSUs #0-#3) 25, two power source control modules #0 and #1 26, and a failure power off (FPO) 27.

While "MP #0" or "MP #1" is used hereinafter for making a reference to particular one of the multiple MPs, "MPs 201" may be used for referring to any of the MPs. Additionally, while "MP-EXT #0" or "MP-EXT #1" is used hereinafter for making a reference to particular one of the multiple MP-EXTs, "MP-EXTs 20a" may be used for referring to any of the MP-EXTs. Furthermore, while "MP-PSU #0" or "MP-PSU #1" is used hereinafter for making a reference to particular one of the multiple MP-PSUs, "MP-PSUs 20b" may be used for referring to any of the MP-PSUs. Additionally, while "SVC #0" or "SVC #1" is used hereinafter for making a reference to particular one of the multiple SVCS, "SVCS 22" may be used for referring to any of the SVCS. Furthermore, while "fan module #0", "fan module #1", "fan module #2", or "fan module #3" is used hereinafter for making a reference to particular one of the multiple fan modules, "fan modules 23" may be used for referring to any of the fan modules. Additionally, while "FRT #0", "FRT #1", "FRT #2", or "FRT #3" is used hereinafter for making a reference to particular one of the multiple FRTs, "FRTs 24" may be used for referring to any of the FRTs. Furthermore, while "PSU #0", "PSU #1", "PSU #2", or "PSU #3" is used hereinafter for making a reference to particular one of the multiple PSUs, "PSUs 25" may be used for referring to any of the PSUs. Additionally, while "power source control module #0" or "power source control module #1" is used hereinafter for making a reference to particular one of the multiple power source control modules, "power source control modules 26" may be used for referring to any of the power source control modules.

In the example depicted in FIG. 1, the hatched rectangles between modules indicate that those modules are communicatively connected through connectors, while the thick solid lines between modules indicate that those modules are communicatively connected through cables.

The MP bridge 21 represents one example of a bridge module, and is configured to communicatively connect the MP #0 and the MP #1. Details of the functional configuration of the MP bridge 21 will be described later with reference to FIG. 9 etc.

The MPs 201 represent examples of first and second board modules, and are apparatuses in a board configuration, configured to communicatively connect the multiple CEs 3. In the relay apparatus 1, the connections of the SVCS 22, the fan modules 23, and the FRTs 24 to the MPs 201 enable power supply to and communication among the SVCS 22, the fan modules 23, and the FRTs 24, via the MPs 201. Multiple CEs 3 are connected to each MP 201 via the corresponding FRT 24 described later. The MP-EXTs 20a, the MP bridge 21, the SVCS 22, the fan modules 23, and the FRTs 24 are connected to the MP 201, so as to be communicative among each other. Specifically, the MP-EXT #0, the MP bridge 21, the SVC #0, the fan modules #0 and #1, and the FRTs #0 and #1 are connected to the MP #0, so as to be communicative to each other. The MP-EXT #1, the MP bridge 21, the SVC #1, the fan modules #2 and #3, and the FRTs #2 and #3 are connected to the MP #1, so as to be communicative to each other.

Each MP-EXT 20a is communicatively connected to an MP 201 and an MP-PSU 20b, and is configured to relay signals sent to or received from the MP 201 and the MP-PSU 20b. Specifically, the MP-EXT #0 is communicatively connected to the MP #0 and the MP-PSU #0, and is configured to relay signals sent to or received from the MP-EXT #0 and the MP-PSU #0. The MP-EXT #1 is communicatively connected to the MP #1 and the MP-PSU #1, and is configured to relay signals sent to or received from the MP-EXT #1 and the MP-PSU #1. Each MP-EXT 20a communicatively couples an MP 201 and an MP-PSU 20b, thereby enabling communications between the SVC 22, the fan modules 23, and the FRTs 24 connected to that MP 201, and the PSUs 25 connected to that MP-PSU 20b.

An MP-EXT 20a, the system panel 17, PSUs 25, a power source control module 26, and the FPO 27 are connected to an MP-PSUs 20b, so as to be communicative to each other. Specifically, the MP-EXT #0, the system panel 17, the PSUs #0 and #1, the power source control module #0, and the FPO 27 are connected to the MP-PSU #0 so as to be communicative to each other. The MP-EXT #1, the system panel 17, the PSUs #2 and #3, the power source control module #1, and the FPO 27 are connected to the MP-PSU #1 so as to be communicative to each other.

The MP-EXTs 20a are provided at a left panel 202 that will be described later with reference to FIG. 7 etc., and the MP-PSUs 20b are provided at PSU connection connectors 207 that will be described later with reference to FIG. 7 etc. Details of the functional configurations of the MP modules 20 including the MPs 201, the MP-EXTs 20a, and the MP-PSUs 20b will be described later with reference to FIG. 7 etc.

The system panel 17 is an input and output device configured to receive various input operations made by an operator, and to display various information to the operator.

The SVCS 22 represent examples of first and second control modules, and are configured to monitor and control the modules in the relay apparatus 1.

The fan modules 23 represent examples of first and second fan modules, and are configured to generate cooling air. The generated cooling air cools the modules in the relay apparatus 1.

The FRTs 24 represent examples of first and second communication modules, and are configured to control communications among the relay apparatus 1 and the CEs 3. The FRTs 24 include multiple connectors (not illustrated), to which respective CMs (not illustrated) of the CEs 3 are connected.

The PSUs 25 represent examples of first and second power supply modules, and are configured to supply power to the modules in the relay apparatus 1.

Each power source control module 26 is configured to turn on or off the power of the modules provided in the relay apparatus 1 in a synchronized manner, based on an instruction from a server apparatus (not illustrated).

The FPO 27 is a switch configured to stop, in the case of a failure in the relay apparatus 1, operations of the failed module.

Figure 3:
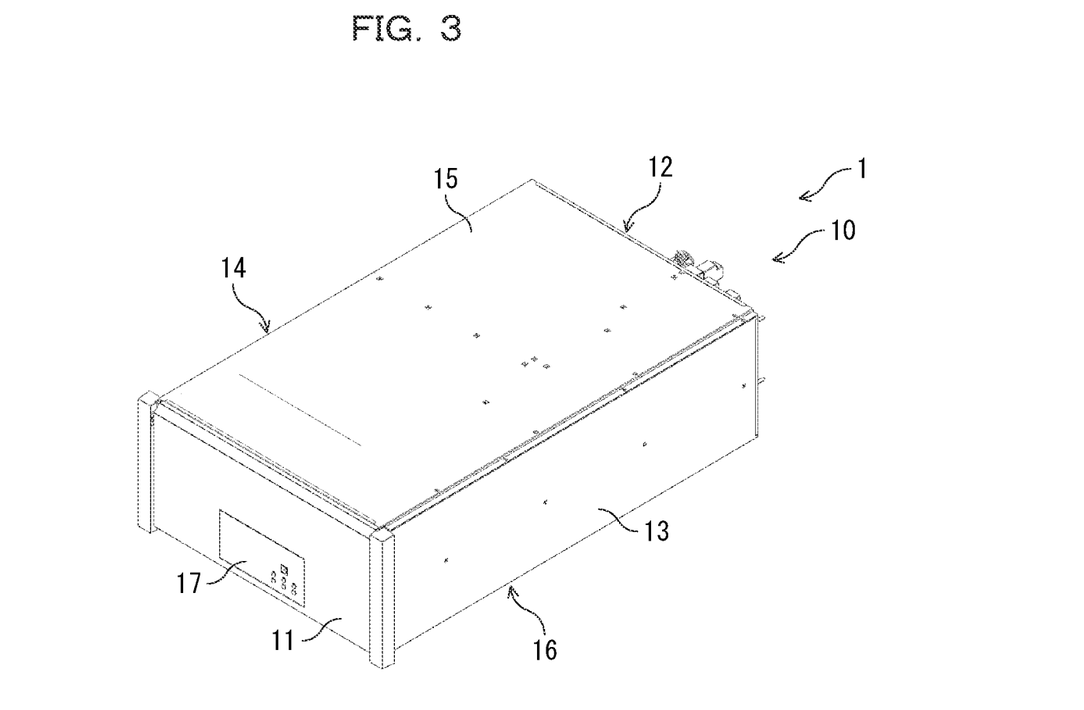
FIG. 3 is a diagram depicting a configuration of a relay apparatus as one example of an embodiment.

FIG. 3 is a diagram depicting a configuration of the relay apparatus as one example of an embodiment.

As depicted in FIG. 3, the casing 10 of the relay apparatus 1 has a box shape where an upper panel 15 and a lower panel 16 in rectangular shapes are disposed parallel to each other, for example. The respective sides of the upper panel 15 and the lower panel 16 are encircled by a front bezel 11, a left panel 13, a rear panel 12, and a right panel 14. The front bezel 11 and the rear panel 12 are disposed parallel to each other, and the left panel 13 and the right panel 14 are disposed parallel to each other.

Hereinafter, upon making references to FIGS. 3-16, the direction from the front bezel 11 to the rear panel 12 or the direction from the rear panel 12 to the front bezel 11 may be referred to as "the front and rear direction". The direction from the left panel 13 to the right panel 14 or the direction from the right panel 14 to the left panel 13 may be referred to as "the left and right direction". The direction from the upper panel 15 to the lower panel 16 or the direction from the lower panel 16 to the upper panel 15 may be referred to as "the up and down direction".

A rectangular opening is formed in a part of the front bezel 11, for example, in which the system panel 17 is fitted.

Figure 4:
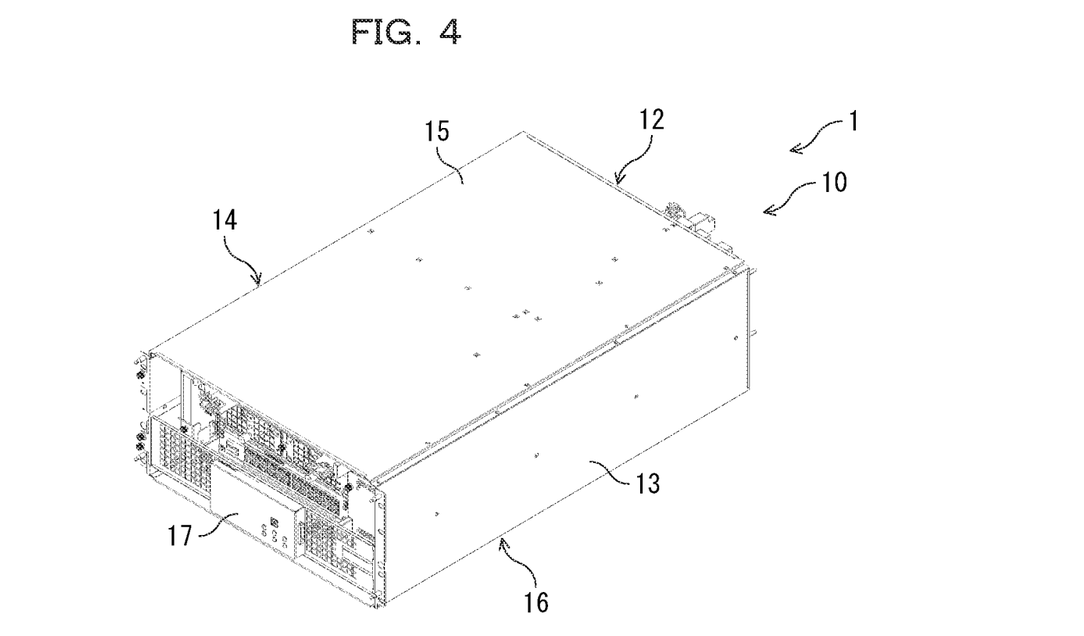
FIG. 4 is a diagram depicting the configuration of the relay apparatus as one example of an embodiment, when a front bezel is removed.

FIG. 4 is a diagram depicting the configuration of the relay apparatus as one example of an embodiment, when the front bezel is removed.

As depicted in FIG. 4, the front bezel 11 can be detachably attached to the relay apparatus 1, independently from the system panel 17.

Figure 5:
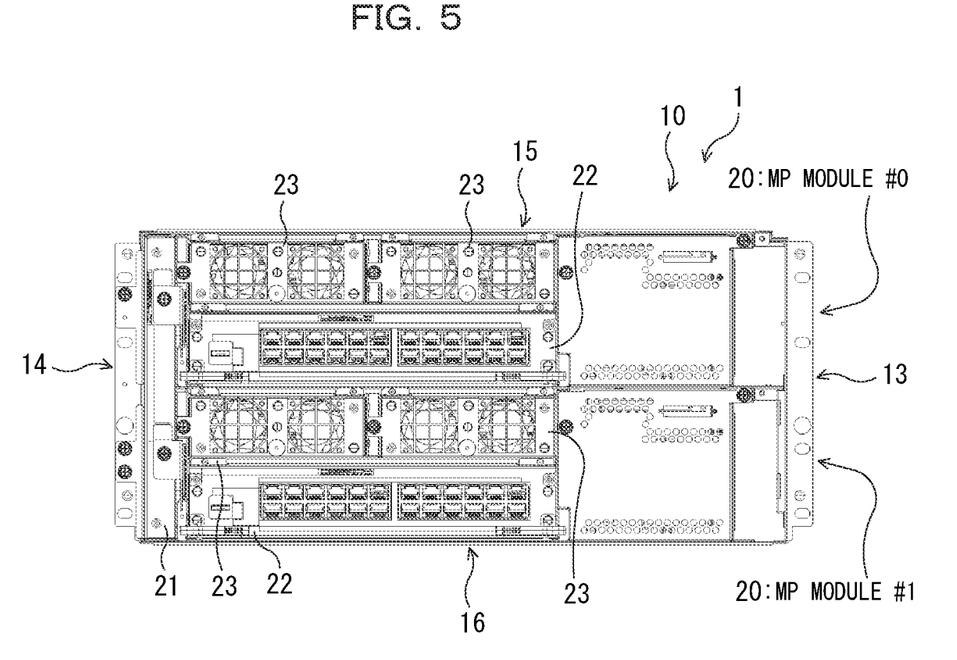
FIG. 5 is a diagram depicting a configuration of the front of the inside of the housing of the relay apparatus as one example of an embodiment.
Figure 6:
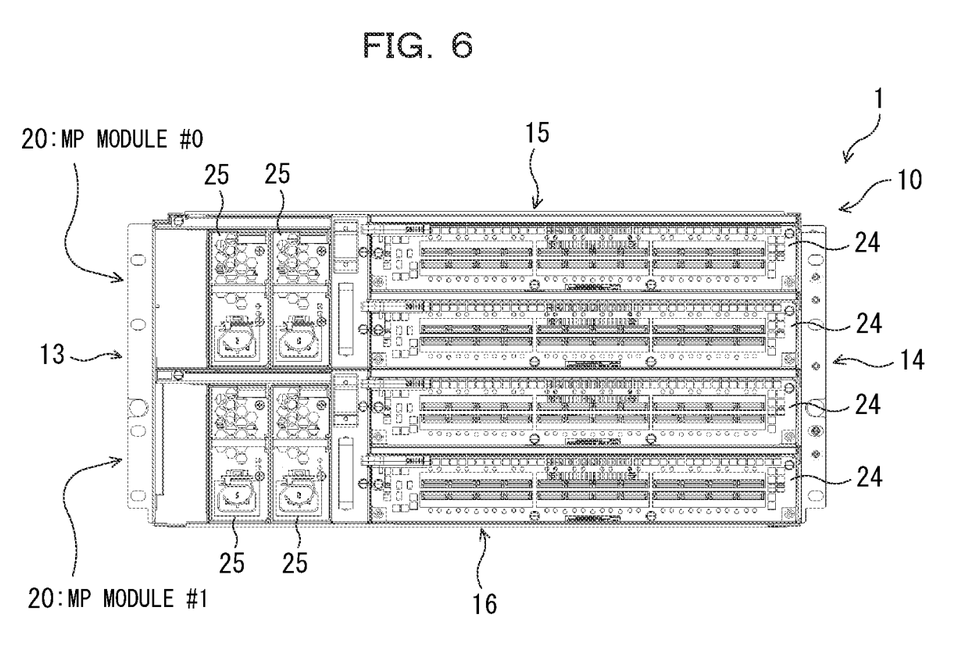
FIG. 6 is a diagram depicting a configuration of the rear of the inside of the housing of the relay apparatus as one example of an embodiment.

FIG. 5 is a diagram depicting a configuration of the front of the inside of the housing of the relay apparatus as one example of an embodiment, and FIG. 6 is a diagram depicting a configuration of the rear of the inside of the housing.

In FIG. 5, the system panel 17, as well as the front bezel 11, is detached from the relay apparatus 1.

While "MP module #0" or "MP module #1" is used hereinafter for making a reference to particular one of the multiple MP modules, "MP module 20" may be used for referring to any of the MP modules.

As depicted in FIGS. 5 and 6, the relay apparatus 1 includes, on the side of the upper panel 15, the SVC #0 22, the fan modules #0 and #1 23, the FRTs #0 and #1 24, and the PSUs #0 and #1 25, connected to the MP module #0. The relay apparatus 1 also includes, on the side of the lower panel 16, the SVC #1 22, the fan modules #2 and #3 23, the FRTs #2 and #3 24, and the PSUs #2 and #3 25, connected to the MP module #1.

In other words, as depicted in FIG. 5, the relay apparatus 1 includes, on the side of the front bezel 11 (not illustrated in FIG. 5), the SVC #0 22 and the fan modules #0 and #1 23, connected to the MP module #0; and the SVC #1 22 and the fan modules #2 and #3 23, connected to the MP #1. As depicted in FIG. 6, the relay apparatus 1 also includes, on the side of the rear panel 12 (not illustrated in FIG. 6), the FRTs #0 and #1 24 and the PSUs #0 and #1 25, connected to the MP module #0; and the FRTs #2 and #3 24 and the PSUs #2 and #3 25, connected to the MP #1.

Furthermore, as depicted in FIG. 5, the relay apparatus 1 includes, on the side of the right panel 14, the MP bridge 21 configured to connect the MP module #0 and the MP module #1. In other words, the relay apparatus 1 includes, on the side of the front bezel 11 (not illustrated in FIG. 5), the MP bridge 21 configured to connect the MP module #0 and the MP module #1. The MP bridge 21 is placed in parallel to the right panel 14.

Figure 7:
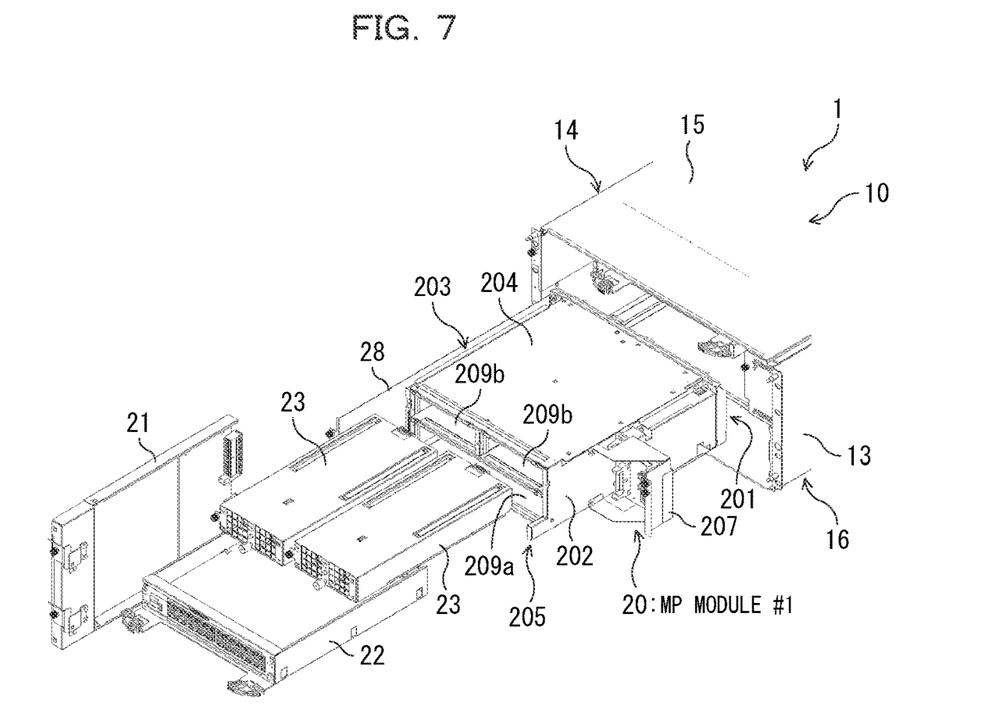
FIG. 7 is an exploded perspective view depicting the front side configuration of the inside of the housing of the relay apparatus as one example of an embodiment.

FIG. 7 is an exploded perspective view depicting the front side configuration of the inside of the housing of the relay apparatus as one example of an embodiment.

In FIG. 7, the MP module #1 and the MP bridge 21 are detached from the relay apparatus 1. The SVC #1 22 and the fan modules #2 and #3 23 are detached from the MP module #1.

An MP module 20 has a configuration where an upper panel 204 and a lower panel 205 in substantially rectangular shapes are disposed parallel to each other, for example. The three sides of the upper panel 204 and the lower panel 205 are encircled by a left panel 202, an MP 201, and a right panel 203. The left panel 202 and the right panel 203 are disposed parallel to each other, and the MP 201 is disposed perpendicular to the left panel 202, the right panel 203, the upper panel 204, and the lower panel 205. The MP module 20 has an opening formed on a surface facing the MP 201, through which an SVC 22 and a fan module 23 can be attached or detached.

The MP 201 has multiple connectors (not illustrated) on the inner side surface of the MP module 20, to which an SVC 22 and fan modules 23 are connected, and has also multiple connectors (not illustrated) on the outer side surface of the MP module 20, to which FRTs 24 are connected. The MP 201 has a dimension on the side of the right panel 203 longer than the length between the left panel 202 and the right panel 203, thereby having a protrusion on the side of the right panel 203. The MP 201 includes an MP bridge connection connector 206 (described later with reference to FIG. 10 etc.) to which the MP bridge 21 is connected, at the protrusion on the side of the right panel 203.

The left panel 202 includes PSU connection connectors 207 protruding from the left panel 202. The PSU connection connectors 207 are connected to PSUs 25. The MP-PSU 20b including the PSU connection connectors 207, depicted in FIG. 1, is disposed parallel to the MP 201. The MP-EXT 20a depicted in FIG. 1 is disposed along the left panel 202 such that the MP 201 and the MP-PSU 20b are connected.

An MP module 20 includes separators separating accommodating units 209a from 209b configured to define spaces, to which an SVC 22 and two fan modules 23 are inserted respectively, for example. The SVC 22 is attached to the accommodating unit 209a on the side of the lower panel 205 of the MP module 20, and the two fan modules 23 are attached adjacent to each other to the respective accommodating units 209b on the side of the upper panel 204 of the MP module 20.

Specifically, the MP module #0 includes an accommodating unit 209a configured to accommodate the SVC #0 22 and accommodating units 209b configured to accommodate the fan modules #0 and #1 23, on the surface on the side to which the SVC #0 22 and the fan modules #0 and #1 23 are provided. The MP module #1 includes an accommodating unit 209a configured to accommodate the SVC #1 22 and accommodating units 209b configured to accommodate the fan modules #2 and #3 23, on the surface on the side to which the SVC #1 22 and the fan modules #2 and #3 23 are provided. The MP bridge 21 is attached to the MP modules #0 and #1, adjacent to the accommodating units 209a, 209b provided at the MP modules #0 and #1, respectively.

Figure 8:
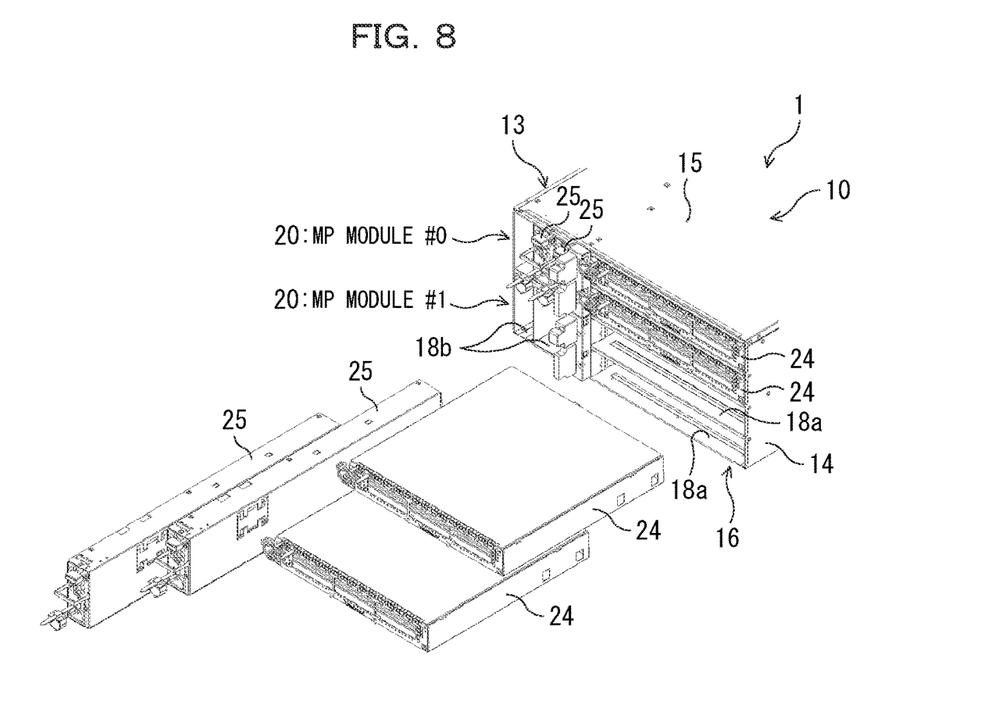
FIG. 8 is an exploded perspective view depicting the rear side configuration of the inside of the housing of the relay apparatus as one example of an embodiment.

FIG. 8 is an exploded perspective view depicting the rear side configuration of the inside of the housing of the relay apparatus as one example of an embodiment.

In FIG. 8, the FRTs #2 and #3 24 and the PSUs #2 and #3 25 are depicted, when being detached from the MP #1 (the relay apparatus 1).

The relay apparatus 1 includes separators separating accommodating units 18a from 18b configured to define respective spaces, to which four FRTs 24 and four PSUs 25 are inserted, for example. In FIG. 8, only accommodating units 18a, 18b without the FRT 24s and the PSUs 25 inserted thereto, are referenced to with reference symbols, among the multiple accommodating units 18a, 18b.

The FRTs #0 and #1 24 to be connected to the MP #0 and the FRTs #2 and #3 24 to be connected to the MP #1, are attached into the accommodating unit 18a, located on the side of the right panel 14 of the relay apparatus 1, adjacent to each other in the up and down direction.

The PSUs #0 and #1 25 to be connected to the MP #0, are attached into the accommodating units 18b located on the side of the left panel 13 and on the side of the upper panel 15, of the relay apparatus 1, adjacent to each other in the left and right direction. The PSUs #2 and #3 25 to be connected to the MP #1, are attached into the accommodating units 18b located on the side of the left panel 13 and on the side of the lower panel 16, of the relay apparatus 1, adjacent to each other in the left and right direction. In other words, the PSU #0 25 to be connected to the MP #0 and the PSU #2 25 to be connected to the MP #1, are attached into the accommodating units 18b located on the side of the left panel 13 of the relay apparatus 1, adjacent to each other in the up and down direction. The PSU #1 25 to be connected to the MP #0 and the PSU #3 25 to be connected to the MP #1, are attached into the accommodating units 18b located between the FRTs #0-#3 24 and the PSU #0 and #2 25, adjacent to each other in the up and down direction.

Figure 9:
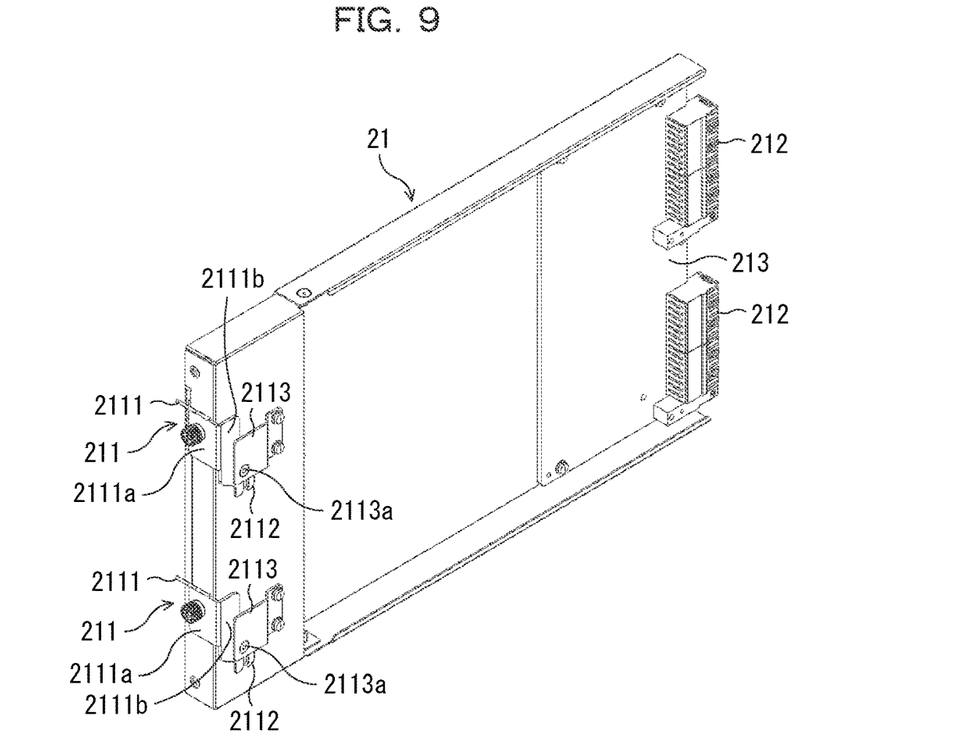
FIG. 9 is a diagram depicting a configuration of an MP bridge as one example of an embodiment.
Figure 10:
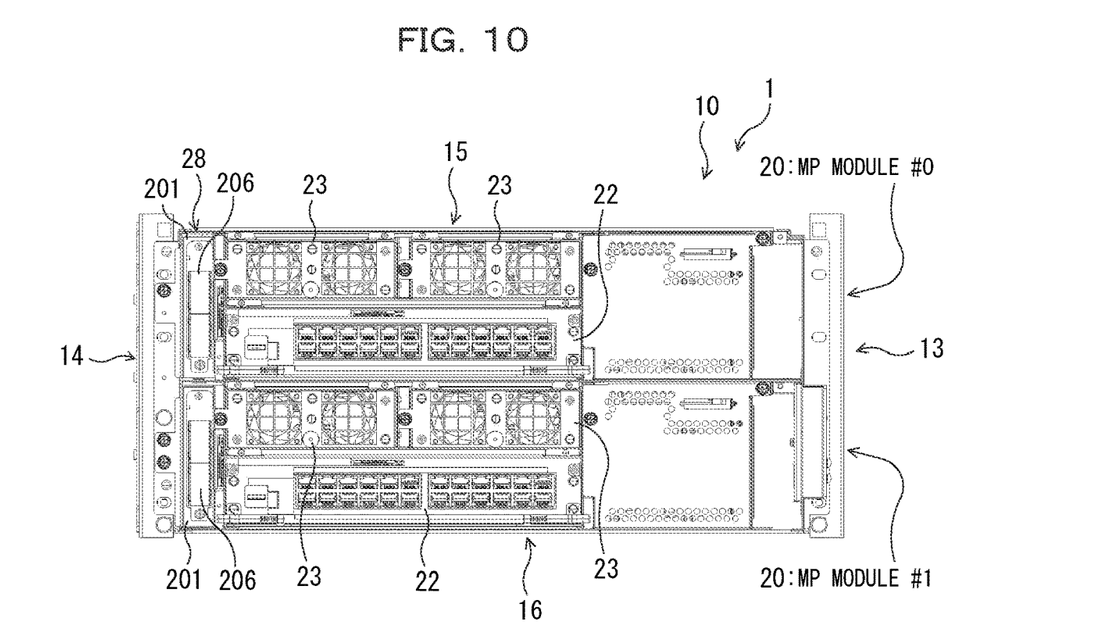
FIG. 10 is a diagram depicting the configuration of the relay apparatus, when the MP bridge is removed, as one example of an embodiment.

FIG. 9 is a diagram depicting a configuration of the MP bridge as one example of an embodiment, and FIG. 10 is a diagram depicting the configuration of the relay apparatus, when the MP bridge is removed.

As depicted in FIG. 9, the MP bridge 21 includes a printed board 213 that is a rectangular board member, and two ejectors 211 and two MP connection connectors 212 are provided on the printed board 213.

The MP bridge 21 is formed as a separate member from the MP #0 and the MP #1, and is configured to connect the MP #0 and the MP #1. In other words, the MP bridge 21 is designed so as to be detached from the relay apparatus 1, independently from detachments of the MP modules #0 and #1 from the relay apparatus 1.

Similarly to FIG. 5, FIG. 10 depicts the relay apparatus 1 viewed from the front, where the MP bridge 21 is detached from the relay apparatus 1.

Behind the slot 28 depicted in FIG. 10, MP bridge connection connectors 206 are provided on the surface on the side of the front bezel 11 (not illustrated in FIG. 10) of the relay apparatus 1 protruding from the right panel 203 in the MPs 201.

The MP connection connectors 212 depicted in FIG. 9 are coupled to the MP bridge connection connectors 206, when the MP bridge 21 is inserted into a slot 28 depicted in FIG. 10. Specifically, one of the two MP connection connectors 212 is coupled to the MP bridge connection connector 206 of the MP #0, whereas the other MP connection connector 212 is coupled to the MP bridge connection connector 206 of the MP #1.

The MP connection connectors 212 of the MP bridge 21 have pins (not illustrated) in two or more different pin lengths such that power pins are shorter than signal pins. The MP connection connectors 212 are designed such that the power pins are decoupled first, followed by decoupling of the signal pins, when the MP connection connectors 212 are decoupled from the MP bridge connection connectors 206 of the MP modules 20. Additionally, the MP connection connectors 212 are designed such that the signal pins are coupled first, followed by coupling of the power pins, when the MP connection connectors 212 are coupled to the MP bridge connection connectors 206 of the MP modules 20.

The printed board 213 has wiring printed thereon, configured to communicatively connect the MP connection connector 212 to the MP #0, and the MP connection connector 212 to the MP #1.

Each ejector 211 includes a knob 2111, a nail 2112, and a fixed part 2113. The knob 2111 and the nail 2112 are formed as a single member from one metal plate, and the fixed part 2113 is formed from one metal plate. The metal plate having the knob 2111 is bent such that a face 2111a becomes perpendicular to a face 2111b.

The fixed part 2113 is a rectangular plate member configured to be fixed to the MP bridge 21 parallel to the printed board 213.

The metal plate having the knob 2111 and the nail 2112 are pivoted relative to the fixed part 2113 on an axis 2113a oriented in the left and right direction. In other words, the metal plate having the knob 2111 and the nail 2112 is rotatable about the axis 2113a pivoted on the fixed part 2113. As will be described later with reference to FIGS. 11-16, an operator operates a knob 2111, which determines the position of the nail 2112, in which a metal plate 208 provided in an MP module 20 is to be fitted.

Hereinafter, the state of an ejector where a knob 2111 is rotated forward may be referred to as "open", whereas the state of the ejector where the knob 2111 is rotated backward may be referred to as "closed".

The tip of a nail 2112 is forked into two sections, and one metal plate 208 of an MP module 20 enters the gap therebetween.

Figure 11:
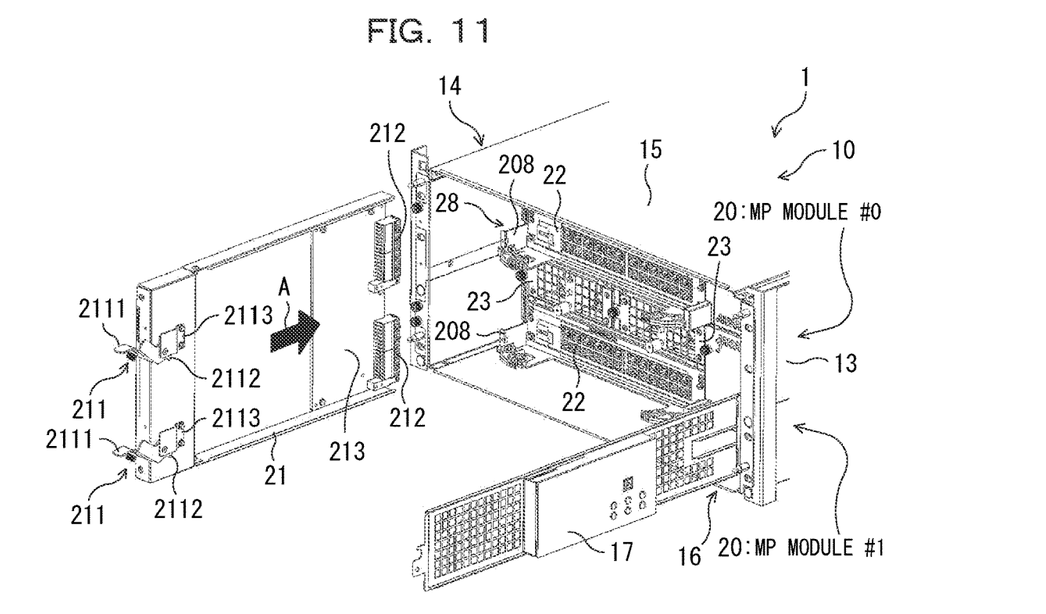
FIG. 11 is a diagram depicting the relay apparatus prior to an attachment of an MP bridge as one example of an embodiment.

FIG. 11 is a diagram depicting the relay apparatus prior to an attachment of an MP bridge as one example of an embodiment.

For attaching an MP bridge 21 to the MP modules 20, the operator moves the MP bridge 21 in the direction of the arrow indicated by Symbol A (backward) while gripping the two knobs 2111 at the open state of the ejectors 211.

Figure 12:
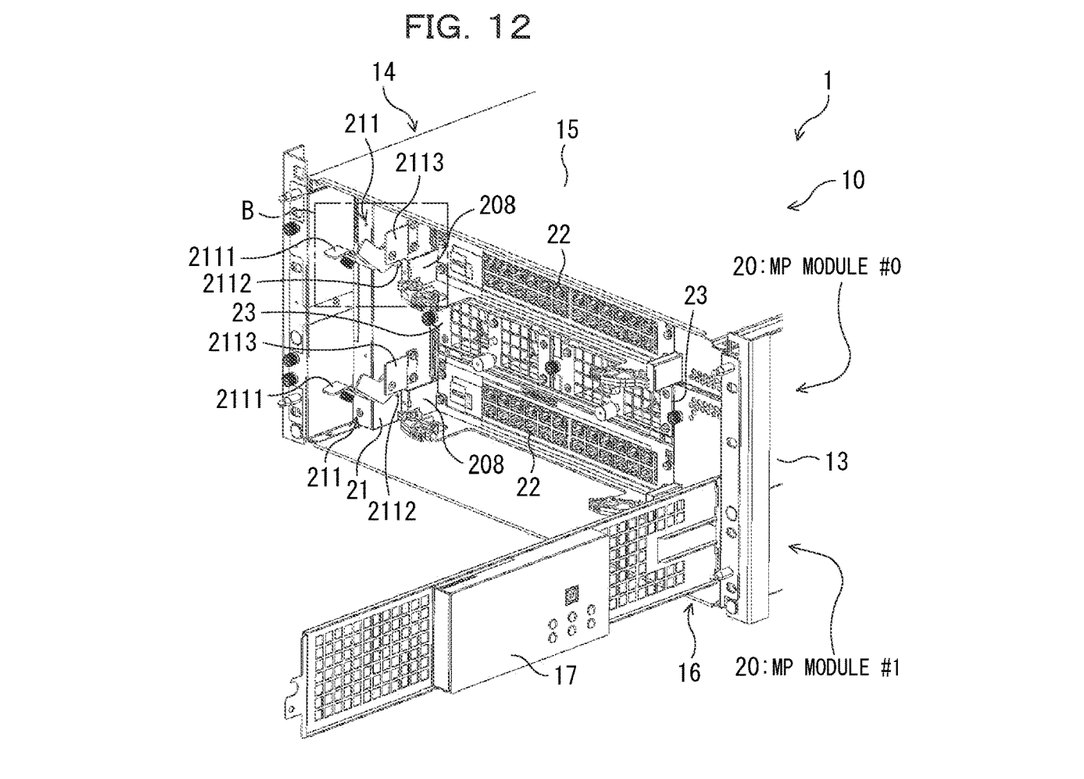
FIG. 12 is a diagram depicting the relay apparatus during an attachment of the MP bridge as one example of an embodiment.
Figure 13:
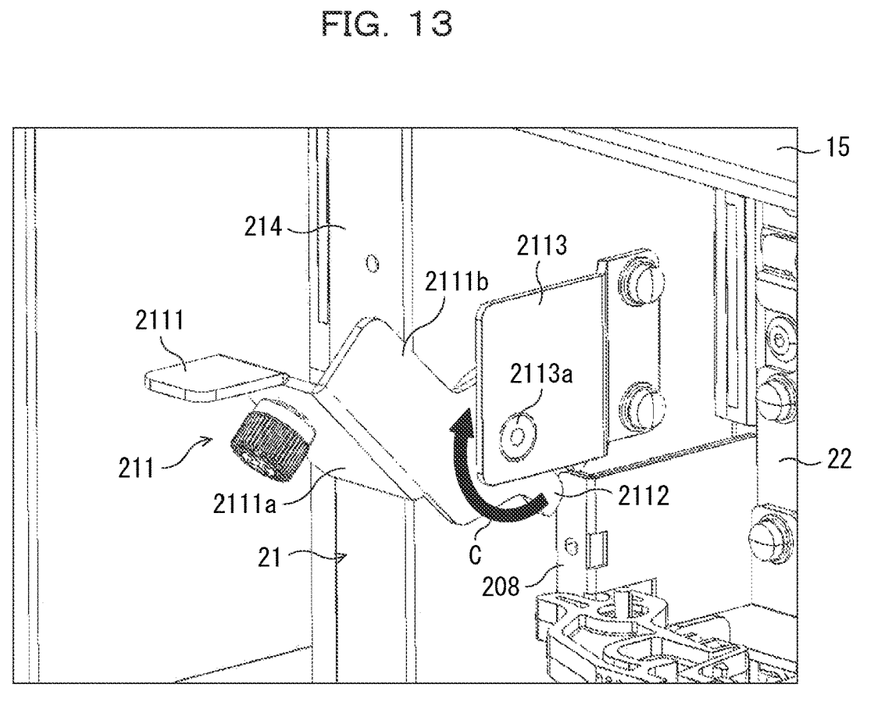
FIG. 13 is an enlarged view depicting an ejector during the attachment of the MP bridge to the relay apparatus as one example of an embodiment.
Figure 14:
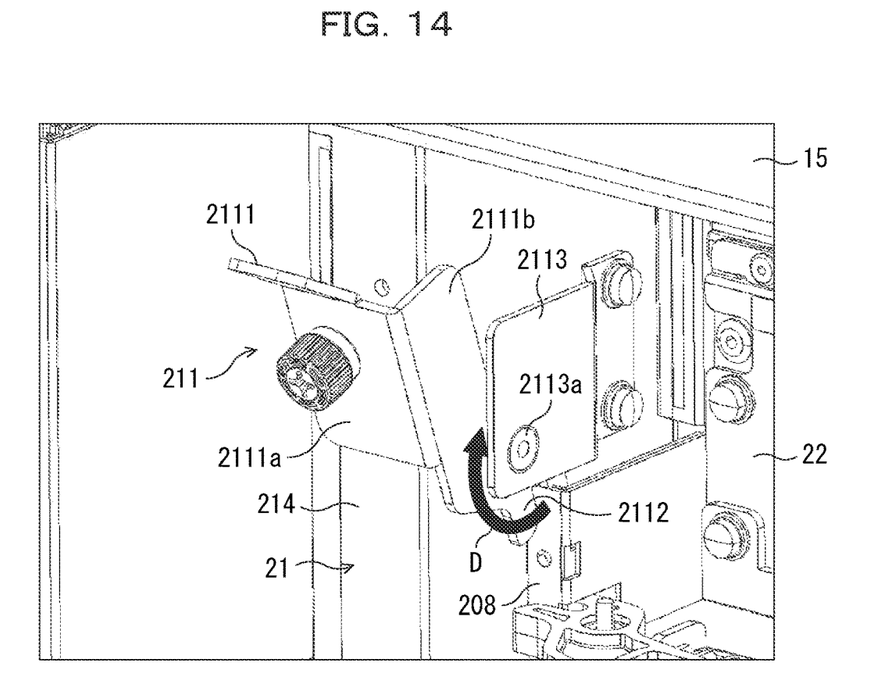
FIG. 14 is an enlarged view depicting the ejector during the attachment of the MP bridge to the relay apparatus as one example of an embodiment.

FIG. 12 is a diagram depicting the relay apparatus during an attachment of the MP bridge as one example of an embodiment, and FIGS. 13, and 14 are enlarged views of an ejector during the attachment.

The region referenced to by Symbol B in FIG. 12 corresponds to FIGS. 13 and 14.

When the ejectors 211 are opened as depicted in FIG. 12, as the operator moves the MP bridge 21 in the direction of the arrow indicated by Symbol A in FIG. 11, the nails 2112 of the ejectors 211 contact metal plates 208 provided at the MP modules 20, as depicted in FIG. 13. As a result, the tops of the metal plates 208 enter into and engage with the respective gaps in the nails 2112.

When the operator rotates the knob 2111 of the ejector 211 about the axis 2113a, in the direction of the arrow indicated by Symbol C in FIG. 13, the nail 2112 starts to fit into the metal plate 208 of the MP module 20, as depicted in FIG. 14. In other words, the rotation of the knob 2111 moves the nail 2112 forward about the axis 2113a (in the direction opposite to the direction indicated by Symbol A in FIG. 11). The metal plate 208 then enters into the gap in the nail 2112. Since the metal plate 208 is fixed to the MP module 20, the ejector 211, i.e., the MP bridge 21, moves backward (in the direction indicated by Symbol A in FIG. 11).

Figure 15:
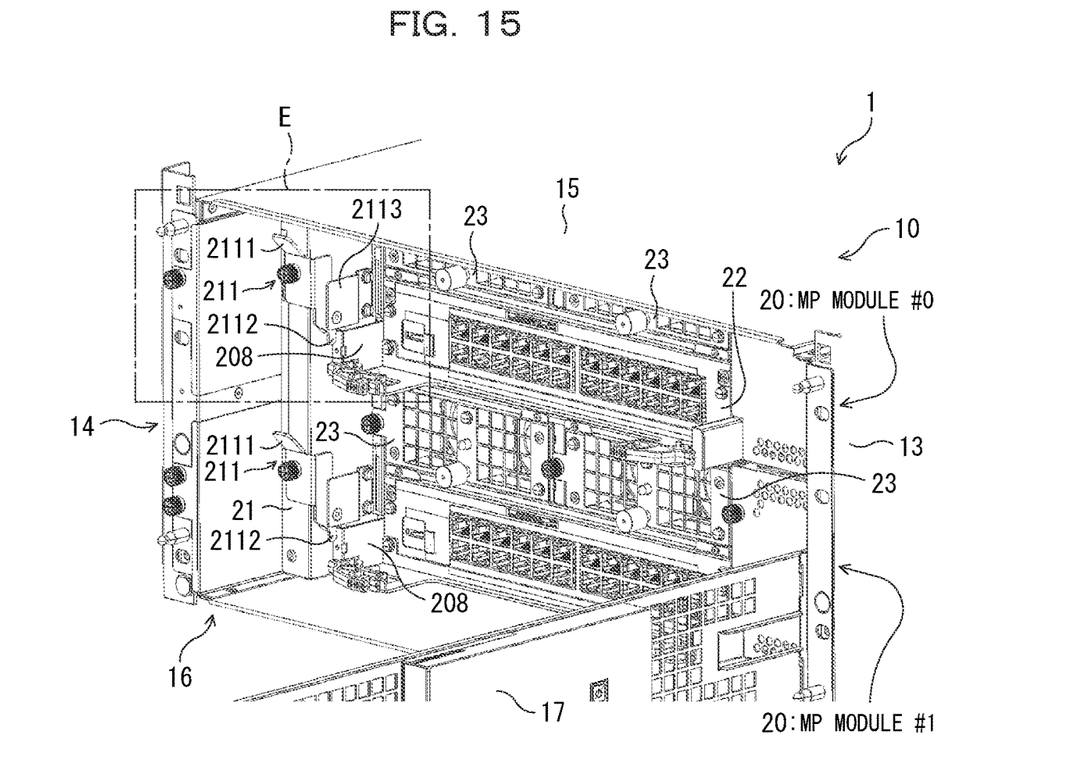
FIG. 15 is a diagram depicting the relay apparatus after the attachment of the MP bridge as one example of an embodiment.
Figure 16:
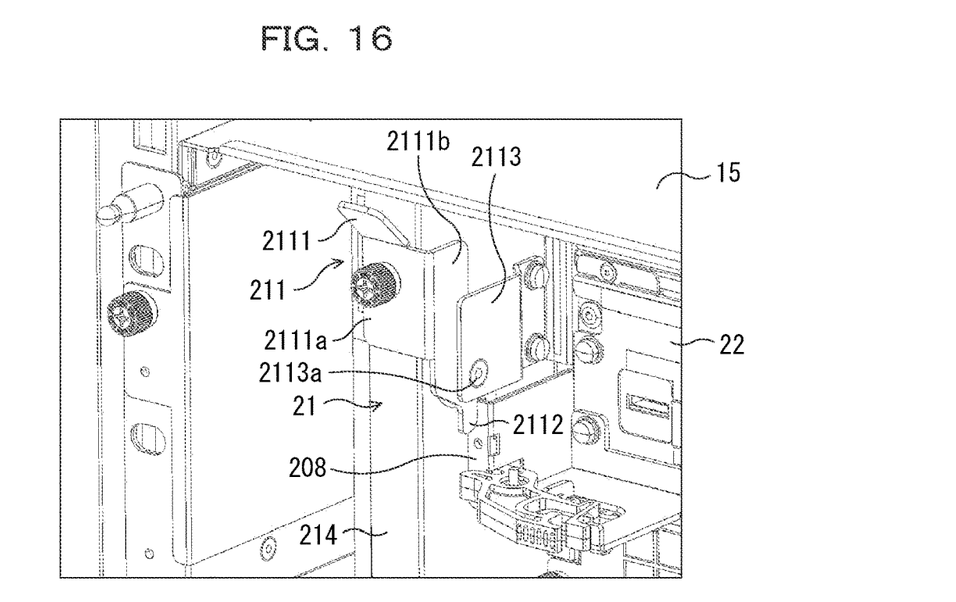
FIG. 16 is an enlarged view depicting the ejector after the attachment of the MP bridge to the relay apparatus as one example of an embodiment.

FIG. 15 is a diagram depicting the relay apparatus after the attachment of the MP bridge as one example of an embodiment, and FIG. 16 is an enlarged view depicting the ejector after the attachment of the MP bridge to the relay apparatus.

The region indicated by Symbol E in FIG. 15 corresponds to the region depicted in FIG. 16.

When the operator further rotates the knob 2111 of the ejector 211 about the axis 2113a in the direction of the arrow indicated by Symbol D in FIG. 14, the nail 2112 fits in the metal plate 208 of the MP module 20, as depicted in FIG. 16. The face 2111a of the metal plate of the knob 2111 contacts a front face 214 of the housing of the MP modules 20. As the ejector 211 moves rearward, the MP connection connectors 212 of the MP bridge 21 are coupled to the MP bridge connection connectors 206 of the MPs 201 in the slot 28.

For inserting the MP bridge 21 into the relay apparatus 1, the operator holds the two ejectors 211 and slides the MP bridge 21 along the slot 28. As a result, the MP connection connectors 212 of the MP bridge 21 are coupled to the MP bridge connection connectors 206 of the MPs 201, without any misalignment.

Figure 17:
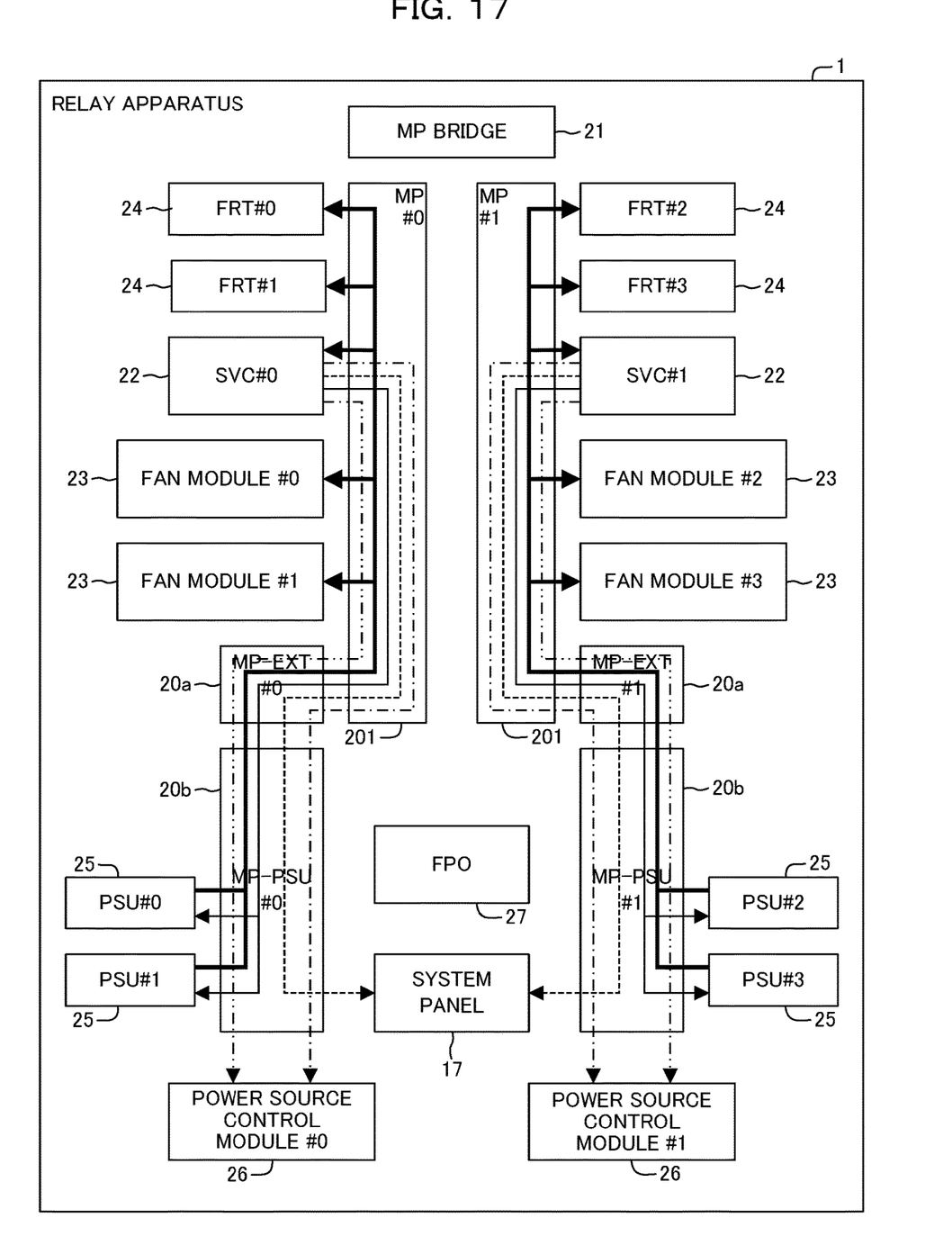
FIG. 17 is a drawing illustrating how power is supplied in the relay apparatus as one example of an embodiment.

FIG. 17 is a drawing illustrating how power is supplied in the relay apparatus as one example of an embodiment.

The thick solid line arrows in FIG. 17 indicate main power, e.g., +12 VL, supplied from the PSUs 25 to the SVCs 22, the fan modules 23, and the FRTs 24. The PSUs #0 and #1 supply the main power to the SVC #0, the fan modules #0 and #1, and the FRTs #0 and #1, whereas the PSUs #2 and #3 supply the main power to the SVC #1, the fan modules #2 and #3, and the FRT #2 and #3.

The thin solid line arrows in FIG. 17 indicate power, e.g., +3.3 VL, supplied from the SVCs 22 to the PSUs 25, for emitting light from light emitting diodes (LEDs) (not illustrated) provided at the PSUs 25. The SVC #0 supplies the power to the PSUs #0 and #1, whereas the SVC #1 supplies the power to the PSUs #2 and #3.

The broken line arrows in FIG. 17 indicate power, e.g., +5.0 VL, supplied from the SVCs 22 to the system panel 17, for emitting light from LEDs (not illustrated) provided at the system panel 17. Both of the SVC #0 and #1 supply the power to the system panel 17.

The chain dotted line arrows in FIG. 17 indicate power, e.g., +5.0 VL, supplied from the SVCS 22 to the power source control modules 26. The SVC #0 supplies the power to the power source control module #0, whereas the SVC #1 supplies the power to the power source control module #1.

The chain double-dashed line arrows in FIG. 17 indicate power, e.g., −24 VL, supplied from the SVCS 22 to the power source control modules 26. The SVC #0 supplies the power to the power source control module #0, whereas the SVC #1 supplies the power to the power source control module #1.

Since the types of power used vary depending on the types of server apparatuses (not illustrated), to which the storage apparatus 100 is to be connected, the SVCS 22 supply power of two different voltage values, i.e., +5.0 VL and −24 VL, to the power source control modules 26.

Figure 18:
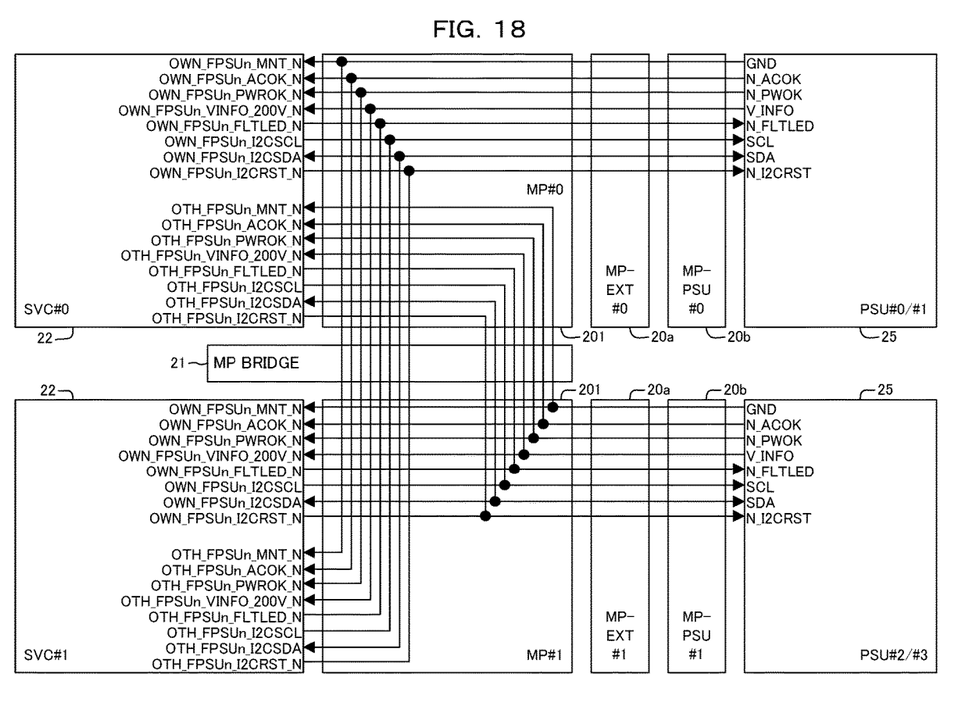
FIG. 18 is a drawing illustrating connections of signal lines in the relay apparatus as one example of an embodiment.

FIG. 18 is a drawing illustrating connections of signal lines in the relay apparatus as one example of an embodiment.

In FIG. 18, the solid line arrows connecting the SVCS 22 and the PSUs 25 indicate that signals are sent to the respective directions indicated by the arrows, and the two-way solid line arrows connecting the SVCS 22 and the PSUs 25 indicate that signals are sent and received bidirectionally between the SVCS 22 and the PSUs 25. The respective labels written next to the arrows in the blocks of the SVCS 22 and the PSUs 25 indicate the names of the terminals (terminal names) provided in the SVCS 22 and the PSUs 25 for sending and/or receiving signals.

In the SVC 22, signal lines directly connecting to the PSU 25 are connected to the terminals having terminal names beginning with "OWN_", via the MPs 201, the MP-EXTs 20a, and the MP-PSUs 20b. Specifically, in the SVC #0, signal lines directly connecting to the PSUs #0 and #1 are connected to the terminals having terminal names beginning with "OWN_", via the MP #0, the MP-EXT #0, and the MP-PSU #0. In the SVC #1, signal lines directly connecting to the PSUs #2 and #3 are connected to the terminals having terminal names beginning with "OWN_", via the MP #1, the MP-EXT #1, and the MP-PSU #1.

In the SVC 22, signal lines connecting to the PSUs 25 are connected to the terminals having terminal names beginning with "OTH_", by way of the MP bridge 21. Specifically, in the SVC #0, signal lines connecting to the PSUs #2 and #3 are connected to the terminals having terminal names beginning with "OTH_", by way of the MP bridge 21. In the SVC #1, signal lines connecting to the PSUs #0 and #1 are connected to the terminals having terminal names beginning with "OTH_", by way of the MP bridge 21.

[A-2] Advantageous Effects

The MPs #0 and #1 are connected to the multiple CEs 3 and are configured to relay communications among these CEs 3, and the MP bridge 21 is configured to communicatively connect the MP #0 and the MP #1. Therefore, it is possible to provide the storage apparatus with redundancy. Specifically, since the redundancy to the MPs 201 is achieved without requiring multiple relay apparatuses 1 connected together with a large number of signal lines, a size reduction of the storage apparatus 100 can be achieved.

The MPs #0 and #1 are detachably attached to the relay apparatus 1, and the multiple CEs 3 are connected via at least one of the MPs #0 and #1 so as to be communicative to each other. As a result, in the case of a failure of any of modules including the MPs 201 in the relay apparatus 1, a hot replacement of the failed module can be made.

The MP bridge 21 is detachably attached to the MPs #0 and #1. Furthermore, the MP bridge 21 is configured to be detached from the relay apparatus 1, independently from detachments of the MP modules #0 and #1 from the relay apparatus 1. As a result, when the MP bridge 21 fails, a hot replacement of the failed MP bridge 21 can be carried out.

The MP bridge 21 includes the board member, the MP connection connector 212 to be connected to the MP #0, and the MP connection connector 212 to be connected to the MP #1. The MP bridge 21 also includes the nails 2112, and the nails 2112 are fitted into the MPs #0 and #1 when the MP bridge 21 is attached to the MPs #0 and #1. This prevents an operator from decoupling, in a misaligned manner, the connectors 212 of the MP bridge 21 from the connectors 206 of the MPs #0 and #1. Therefore, any disruption of the power sequence is eliminated, which ensures an active maintenance (hot maintenance).

The MPs #0 and #1 are provided side by side on the same plain, and have identical shapes. This helps to reduce the manufacturing costs of the MPs 201.

The SVC #0, the fan modules #0 and #1, the FRTs #0 and #1, and the PSUs #0 and #1 are connected to the MP #0, whereas the SVC #1, the fan modules #2 and #3, the FRTs #2 and #3, and the PSUs #2 and #3 are connected to the MP #1. As a result, two separate redundant configurations are provided for the internal connections of the relay apparatus 1, which improves the reliability of the storage apparatus 100. Hence, even in the case of a failure of any of modules provided in the relay apparatus 1, it is possible to continue operations of the system.

The PSU #0 supplies power to the SVC #0, the fan modules #0 and #1, and the FRTs #0 and #1, whereas the PSU #1 supplies power to the SVC #1, the fan modules #2 and #3, and the FRTs #2 and #3. This prevents a system down from occurring, in the case of a failure at a single point in the relay apparatus 1. Specifically, the supplied power in the MP #0 system is independent from the supplied power in the MP #1 system. Thus, in the case of a signal failure in the MP bridge 21, an MP 201 operating normally recognizes that the failure occurs on the other MP 201 and that this MP 201 is operating normally. Accordingly, the failure does not spread to the MP 201 operating normally, and misdetection of the power failure is prevented.

The Power supply paths do not pass the MP bridge 21. This prevents a system power failure in the case of a power failure due to a failed power supply path in the MPs 201. A system power failure is also prevented in the case of a short circuit in capacitors (not illustrated) provided in the MPs 201.

The two independent power supply paths are provided from the SVCS 22 to the system panel 17: the MP #0 system and the MP #1 system. Therefore, in the case of a power short caused by pinching of a cable into the housing, either the SVC #0 or the SVC #1 of the two systems can continue its operation.

[B] Miscellaneous

The disclosed technique is not limited to the aforementioned embodiment, and it may be practiced in a various modifications without departing from the extent thereof. The configurations and the processes in the present embodiment may be arbitrarily selected or omitted, or may be combined where appropriate.

In accordance with the disclosed relay apparatus, it is possible to provide a storage apparatus with redundancy.

All examples and conditional language recited herein are intended for the pedagogical purposes of aiding the reader in understanding the invention and the concepts contributed by the inventor to further the art, and are not to be construed limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A relay apparatus that relays communications among a plurality of electronic devices provided in a storage apparatus, the relay apparatus comprising:
    a first hardware board configured to relay the communications among the plurality of electronic devices, the plurality of electronic devices being connected to the first hardware board;
    a second hardware board configured to relay the communications among the plurality of electronic devices and have an identical shape as the first hardware board, the plurality of electronic devices being connected to the second hardware board;
    a hardware bridge configured to communicatively connect the first hardware board and the second hardware board;
    first and second controllers configured to control the relay apparatus;
    first and second fans configured to generate cooling air;
    first and second communicators configured to communicatively connect the relay apparatus and the plurality of electronic devices; and
    first and second power suppliers configured to supply power to the relay apparatus,
    the first controller, the first fan, the first communicator, and the first power supplier are connected to the first hardware board, and
    the second controller, the second fan, the second communicator, and the second power supplier are connected to the second hardware board,
    the first and second hardware boards are provided side by side on a same plane and are detachably attached to the relay apparatus;
    the hardware bridge is detachably attached to the first and second hardware boards;
    the hardware bridge comprises a structure that is to be detached from the relay apparatus, independently of the detachment of the first and second hardware boards from the relay apparatus; and
    the plurality of electronic devices are connected so as to be communicative to each other, through at least one of the first and second hardware boards.

2. The relay apparatus according to claim 1, wherein the hardware bridge comprises:
    a plate member;
    a first connector that is connected to a first hardware board; and
    a second connector that is connected to a second hardware board.

3. The relay apparatus according to claim 2, wherein the hardware bridge comprises a nail,
    when the first and second hardware boards are attached to the hardware bridge, the nail engages with the first and second hardware boards.

4. The relay apparatus according to claim 1, wherein
the hardware bridge comprises a nail,
when the first and second hardware boards are attached to the hardware bridge, the nail engages with the first and second hardware boards.
5. The relay apparatus according to claim 1, wherein
the first controller and the first fan are provided on a side opposite to the first communicator, having the first hardware board interposed therebetween, and
the second controller and the second fan are provided on a side opposite to the second communicator, having the second hardware board interposed therebetween.
6. The relay apparatus according to claim 1, wherein
the first power supplier supplies power to the first controller, the first fan, and the first communicator, and
the second power supplier supplies power to the second controller, the second fan, and the second communicator.
7. The relay apparatus according to claim 1, wherein
the first hardware board comprises a first accommodating unit configured to accommodate the first controller and a second accommodating unit configured to accommodate the first fan, on a surface on a side where the first controller and the first fan are provided,
the second hardware board comprises a third accommodating unit configured to accommodate the second controller and a fourth accommodating unit configured to accommodate the second fan, on a surface where the second controller and the second fan are provided, and
the hardware bridge is attached to the first and second hardware boards, adjacent to the first, second, third, and fourth accommodating units.

* * * * *